United States Patent
Nagase et al.

(10) Patent No.: US 11,299,927 B2
(45) Date of Patent: Apr. 12, 2022

(54) TAILGATE AND OCCUPANT STEP SYSTEM WITH KICK SENSOR

(71) Applicant: AISIN TECHNICAL CENTER OF AMERICA, INC., Northville, MI (US)

(72) Inventors: Koji Nagase, Novi, MI (US); Daisuke Yamada, Ann Arbor, MI (US)

(73) Assignee: AISIN TECHNICAL CENTER OF AMERICA, INC., Northville, MI (US)

( * ) Notice: Subject to any disclaimer, the term of this patent is extended or adjusted under 35 U.S.C. 154(b) by 165 days.

(21) Appl. No.: 16/259,368

(22) Filed: Jan. 28, 2019

(65) Prior Publication Data
US 2020/0240197 A1 Jul. 30, 2020

(51) Int. Cl.
*E05F 15/73* (2015.01)
*B60R 3/02* (2006.01)
*H03K 17/955* (2006.01)

(52) U.S. Cl.
CPC ............... *E05F 15/73* (2015.01); *B60R 3/02* (2013.01); *H03K 17/955* (2013.01); *E05Y 2400/82* (2013.01); *E05Y 2400/858* (2013.01); *E05Y 2900/531* (2013.01); *E05Y 2900/546* (2013.01)

(58) Field of Classification Search
CPC ......... E05F 15/73; B60R 3/02; H03K 17/955; E05Y 2900/531; E05Y 2400/858; E05Y 2900/546; E05Y 2400/82; G06K 9/00335; G06F 3/017; G06F 1/1694; G06F 2203/04808; G06F 2203/0381; G06F 2200/1636; G06F 16/436; G06F 3/04883; G06F 3/0488; G06F 3/0487; B66F 9/07572; B60P 1/4471; B60P 1/445; A61G 3/062; G05B 2219/35444; A61B 2017/00207; B60K 2370/146; B60K 2370/1464; B60K 2350/1052; H04N 1/00381

See application file for complete search history.

(56) References Cited

U.S. PATENT DOCUMENTS

| | | | |
|---|---|---|---|
| 7,367,574 B2 | 5/2008 | Leitner | |
| 9,470,033 B1 | 10/2016 | Dudar | |
| 9,845,632 B2 | 12/2017 | Dezorzi et al. | |
| 10,077,002 B2 | 9/2018 | Okuyama | |
| 2013/0234828 A1* | 9/2013 | Holzberg | B60R 25/01 340/5.72 |

(Continued)

*Primary Examiner* — Christian Chace
*Assistant Examiner* — Aaron C Smith
(74) *Attorney, Agent, or Firm* — Oblon, McClelland, Maier & Neustadt, L.L.P.

(57) ABSTRACT

An interlocking occupant step apparatus and method for a vehicle, includes a powered door, a powered occupant step, a kick sensor, and a controller having processing circuitry. While in an interlocking state, the processing circuitry detects a first gesture signal from the kick sensor, for example resulting from a kick, upon detection of the first gesture signal, controls operation of the powered occupant step to move the occupant step to an extended position, and controls operation of the powered door to move to an opened position. The processing circuitry detects a second gesture signal from the kick sensor, for example resulting from a lateral swing, the second gesture signal being for a second gesture different from the first gesture. Upon detection of the second gesture signal, the processing circuitry switches to a non-interlocking state.

20 Claims, 4 Drawing Sheets

(56) References Cited

U.S. PATENT DOCUMENTS

| | | | |
|---|---|---|---|
| 2016/0039365 A1* | 2/2016 | Vanderwall | B60C 23/0477 |
| | | | 701/36 |
| 2016/0339844 A1* | 11/2016 | Pribisic | B60R 3/02 |
| 2017/0152697 A1 | 6/2017 | Dehelean et al. | |
| 2017/0232932 A1* | 8/2017 | Nishidai | B60R 25/23 |
| | | | 340/5.61 |
| 2017/0298675 A1* | 10/2017 | Dimig | B60Q 1/0076 |
| 2018/0344545 A1* | 12/2018 | Khafagy | B66F 9/07572 |

* cited by examiner

TAILGATE AND OCCUPANT STEP SYSTEM WITH KICK SENSOR

BACKGROUND OF THE INVENTION

Field of the Invention

The present disclosure relates generally to interlocking operation of a vehicle tailgate and an occupant step, and particularly a controller that controls interdependent operation of the vehicle tailgate and the occupant step.

Description of the Related Art

Vehicles having a truck bed, such as a pickup truck or similar vehicles may be provided with a bed step (herein also referred to as an occupant step). The occupant step is a step that can be used to easily get on and off a tailgate of the vehicle in order to load and unload items in the truck bed. Both the occupant step and the tailgate may be driven by motors. Each of the motors may be controlled by electronic control units (ECU's). One motor extends the occupant step. The other motor opens the tailgate. Each motor may perform an inverse operation of retracting the occupant step and closing the tailgate, respectively. In some cases, a vehicle may be equipped with two occupant steps, one in the vicinity of each corner in the rear of the vehicle.

To operate the motor driven occupant step and motor driven tailgate, a person will approach the rear of the vehicle and may grip a handle on the tailgate. The person will press or lift the handle to release the tailgate latch. Releasing the tailgate latch causes the motor driven occupant step to extend. The releasing of the tailgate latch will also cause the tailgate to open. The person may then step on the occupant step up to the tailgate and enter the truck bed. However, the motor operated occupant step and the motor operated tailgate are independently controlled by respective ECU's.

The foregoing "Background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention.

SUMMARY OF THE INVENTION

The present disclosure relates to a tailgate interlocking occupant step for a vehicle having a truck bed. An interlocking occupant step apparatus and method includes a powered door, a powered occupant step, a kick sensor, and a controller having processing circuitry. While in an interlocking state, the processing circuitry detects a first gesture signal from the kick sensor, upon detection of the first gesture signal, controls operation of the powered occupant step to move the occupant step to an extended position, and controls operation of the powered door to move to an opened position. The processing circuitry detects a second gesture signal from the kick sensor, the second gesture signal being for a second gesture different from the first gesture. Upon detection of the second gesture signal, the processing circuitry switches to a non-interlocking state.

The foregoing paragraph has been provided by way of general introduction, and is not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
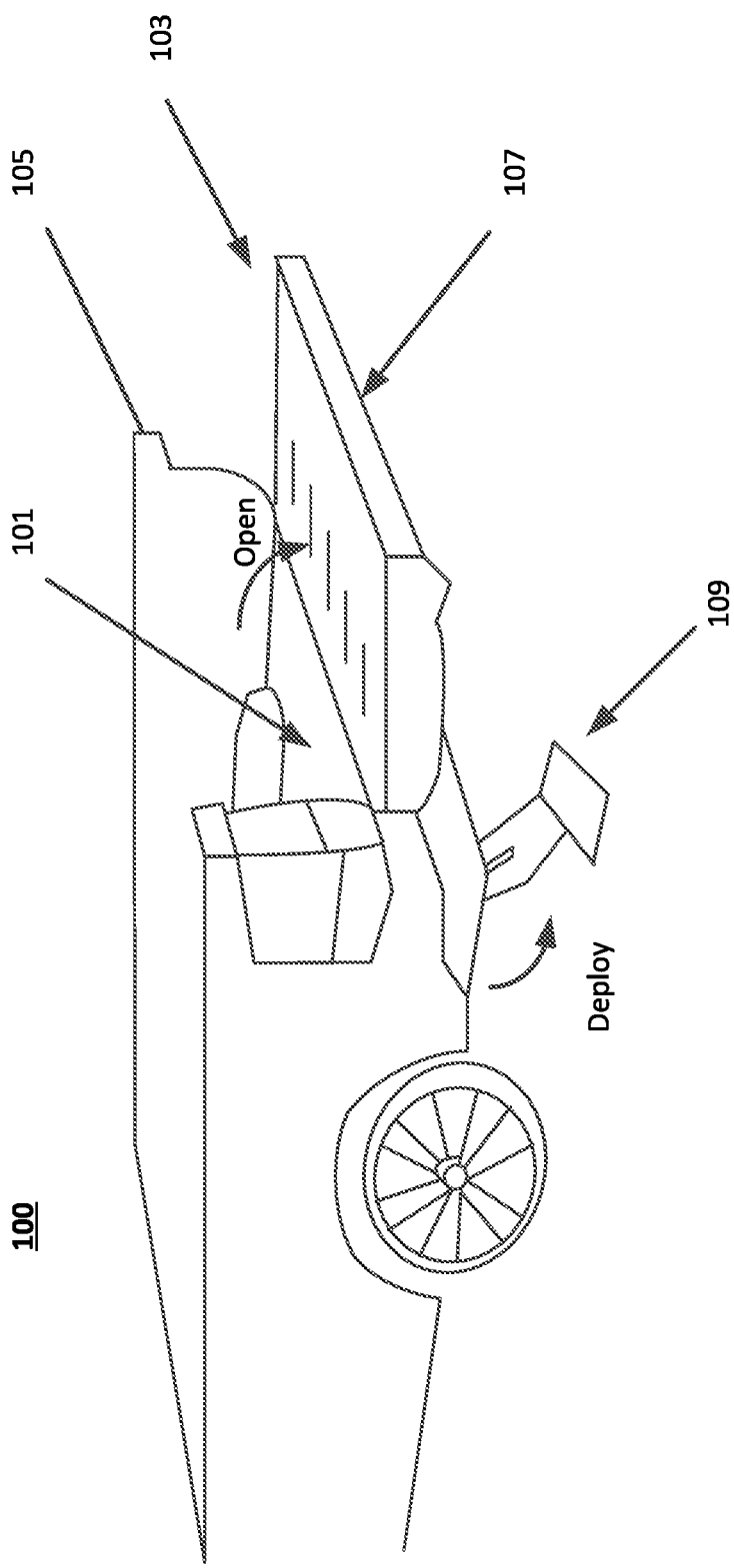
FIG. 1 illustrates a vehicle having a tailgate and occupant step to allow a person to step into a truck bed.

Referring now to the drawings, wherein like reference numerals designate identical or corresponding parts throughout several views, the following description relates to a tailgate interlocking occupant step assembly for a vehicle. Vehicles may include powered occupant steps and powered tailgates that are independently controlled and operated. FIG. 1 illustrates a vehicle having a tailgate and an occupant step. One mode of operation of the vehicle 100 has been for a person to grip the tailgate handle 107, causing the tailgate latch 105 to be released. Upon release of the tailgate latch 105, a motor-operated occupant step 109 is deployed, and then a dampened tailgate 103 opens. In a case that a person is hit by the occupant step 109 when it is being operated to extend and a pinch is detected, the operation of the occupant step 109 may be stopped by its respective electronic control unit (ECU). A pinch may be detected, for example, when the motor for the occupant step receives a force in the opposite direction of operation movement that causes the motor rotation speed to change or an increase in load on the motor is detected that greater than a predetermined threshold. However, the tailgate 103 may continue an opening operation. Also, external switches may be necessary to confirm that the tailgate 103 is in an opened state or a closed state. Disclosed are embodiments that provide a solution to these problems.

Figure 2:
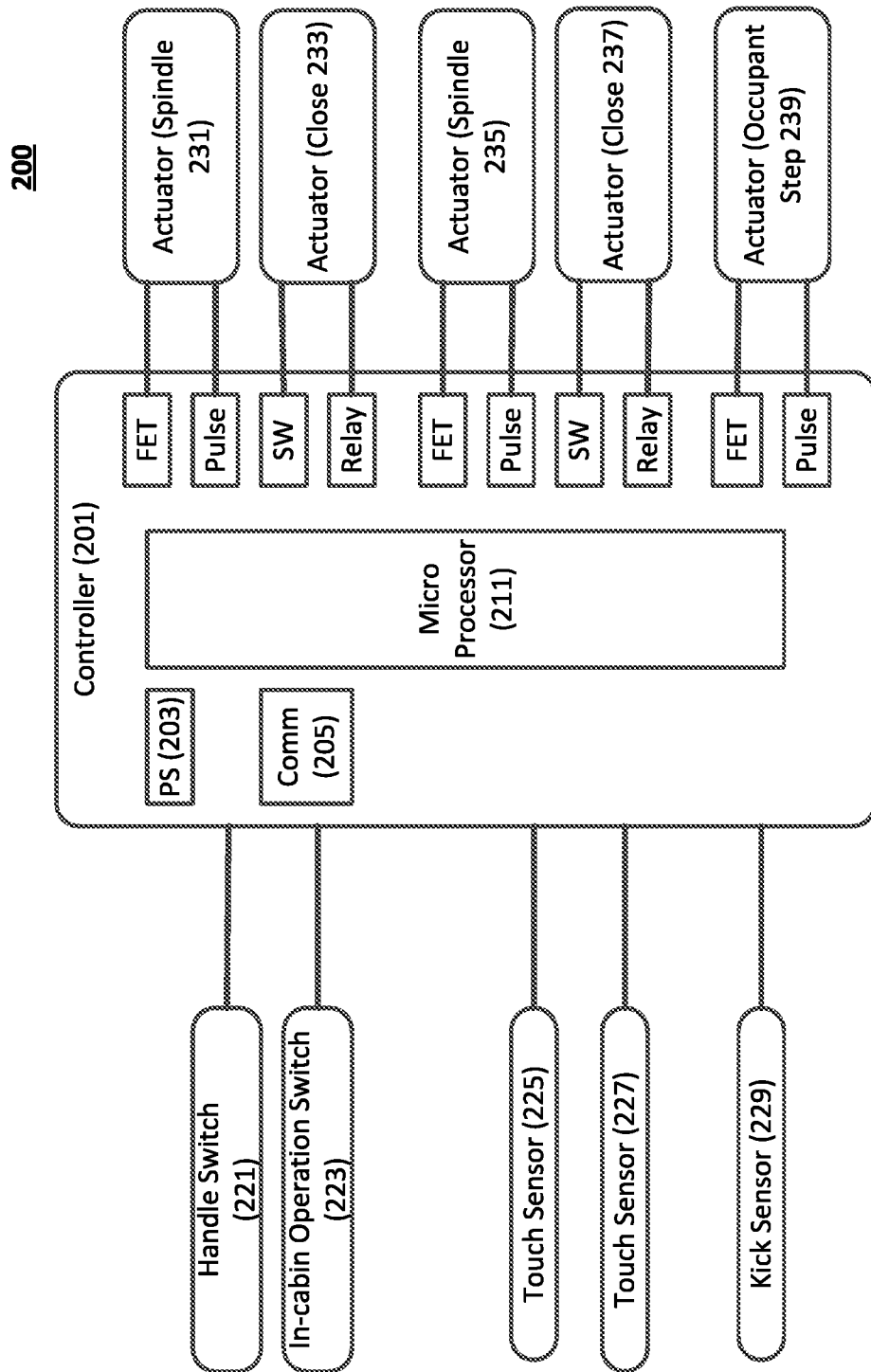
FIG. 2 is a block diagram of a control system in accordance with an exemplary aspect of the disclosure.

FIG. 2 is a block diagram of a control system in accordance with an exemplary aspect of the disclosure. The drawing is for purposes of explaining a basic controller and is non-limiting. The control system 200 may include a controller 201 having a micro-processor 211 implemented as processing circuitry. The controller 201 may include a power supply 203 and a communications circuit 205 for interfacing with other controllers in the vehicle and/or other external control devices. The controller 201 may include one or more digital and/or analog interfaces for sensors, providing input signals to the controller 201. The controller 201 may include specialized circuits and relays providing output control signals for control of actuators.

The micro-processor 211 may be an integrated circuit board having a processing chip, memory modules and I/O interfaces. The micro-processor 211 may include a security chip and other specialized processing devices such as a math co-processor. Memory modules may include Read Only Memory (ROM), Random Access Memory (RAM) and variants of non-volatile and volatile memory. In the case of a security chip, the security chip may have a dedicated secure memory. Any or all of the processors may include one or more processor cores.

Types of sensors may include a handle switch 221, an in-cabin operation switch 223, touch sensors 225, 227, and a kick sensor 229. The control system 200 is not limited to the sensors depicted in the drawing. For example, there may be several handle switches 221 and in-cabin operation switches 223 depending on the arrangement of the vehicle. The number and arrangement of touch sensors 225, 227 is dependent on the size and configuration of a touch surface or various touch surfaces on the vehicle. There may be several different kick sensors, each of different type and arrangement, or similar sensors at different locations. In addition, the controller 201 may receive signals from other types of sensors depending on the configuration of the particular vehicle.

Types of actuators may include actuators for small motors that can perform operations such as open and close doors or lift gates. An actuator for a motor may rotate a spindle. An aspect is an actuator that rotates a spindle 231 that moves a door or tailgate to an opened position. The actuator 231 may be controlled to stop operation of opening the door or tailgate at a position that is between fully closed or fully opened upon detection of an opposing force. In some embodiments an opposing force may be determined by detection of a predetermined torque on the respective motor spindle. The opposing force may be encountered when the door or tailgate comes into contact with a person or some other object and the person or other object is either not movable, or pushes back against the door or tailgate. There may be any number of actuators, e.g., 233, 235, 237, depending on the arrangement of doors and tailgate for a particular vehicle.

The control system 200 may include one or more actuators 239 for powered occupant steps. The actuators for the powered occupant steps may be controlled to stop operation at an intermediate position when an opposing force is detected. An opposing force may be encountered when an occupant step comes into contact with an obstacle. A powered occupant step may be a motor operated occupant step or may be powered by another device such as a hydraulic system.

Figures 3A, 3B:
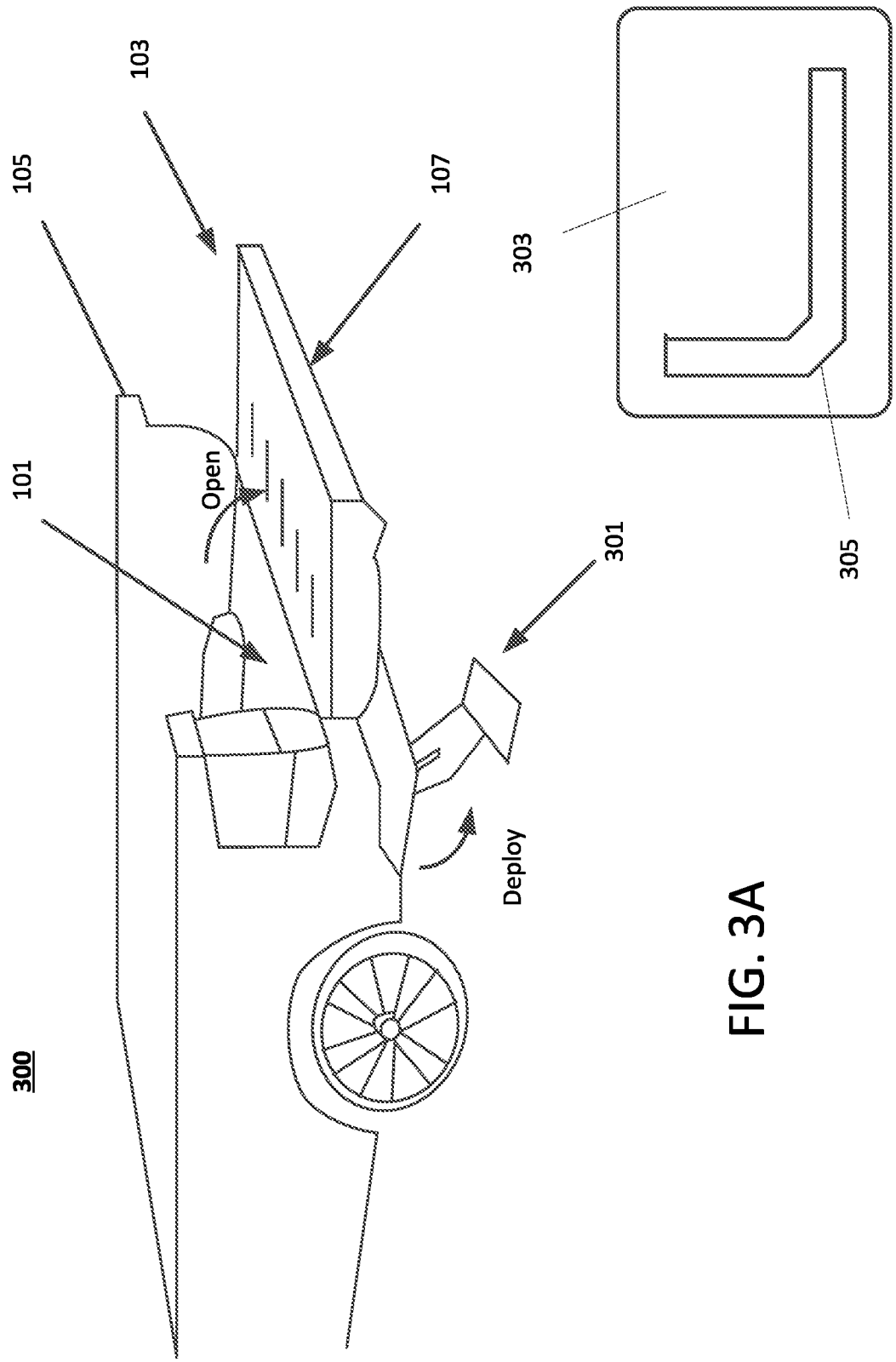
FIGS. 3A, 3B illustrates a vehicle having a tailgate and occupant step in accordance with an exemplary aspect of the disclosure.

FIGS. 3A and 3B illustrate a vehicle having a tailgate and occupant step in accordance with an exemplary aspect of the disclosure. In addition to a bed 101, tailgate 103, door handle 107 (underneath the tailgate when the tailgate is in the fully opened position), and tailgate latch 105, the vehicle 300 includes a powered occupant step 301. The occupant step 301 may be operated by detection of a kick sensor 305. The kick sensor 305 is a sensor that indicates that another object is proximate to the sensor. An example of a kick sensor 305 may be a capacitive proximity sensor having a plate through which current flows as an object comes within a certain distance of the sensor. The plate may be of such a shape that it will detect a person's foot moving to within a certain distance of the plate. In some embodiments, the plate is substantially L-shaped formed along the corner of the occupant step that faces the corner of the vehicle where the occupant step is mounted. The plate may also be C-shaped or rectangular shaped depending on such factors as the size of the occupant step, or the height of the underside of the vehicle from the ground. The plate may be made of a conductive metal that will maintain conduciveness over time, such as stainless steel. In some embodiments, the capacitive sensor detects an approaching object by a change in capacitance to a predetermined capacitance threshold.

Figure 4:
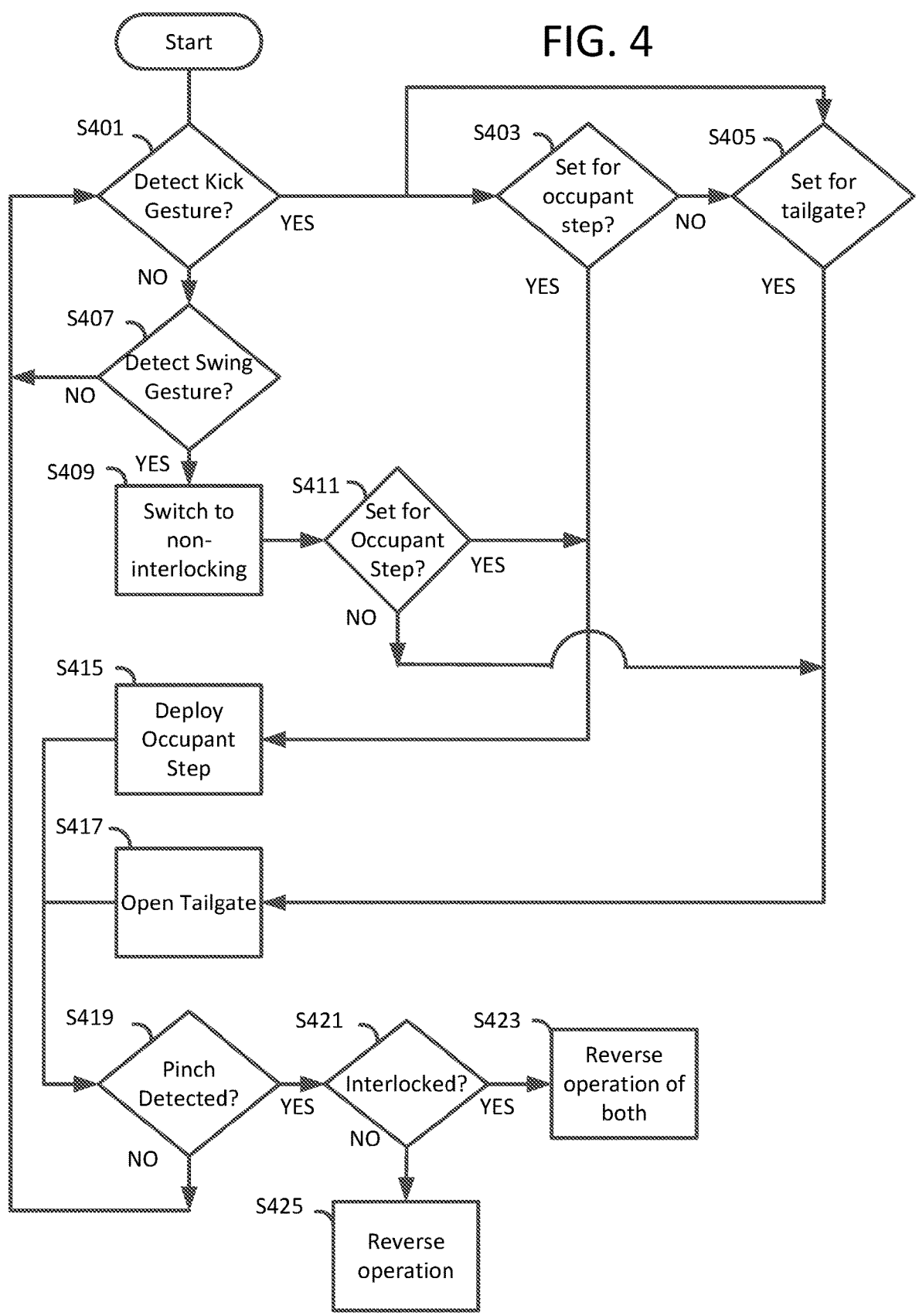
FIG. 4 is a flowchart for operation of the control system of FIG. 2.

FIG. 4 is a flowchart for operation of the control system of FIG. 2. The flowchart assumes a starting state in which the vehicle tailgate 103 is in a closed position and an occupant step 301 is in a retracted state. The flowchart also assumes that the kick sensor 305 is configured to detect a kick gesture performed by a person. In S301, upon detection of a kick gesture (YES in S401), the controller 201 checks settings for the occupant step 301 and tailgate 103. In some embodiments, the controller 201 may be set through a user interface, such as a touchscreen, to operate one of the occupant step 301 and the tailgate 103, or both when a kick gesture is detected by the kick sensor 305. In S403, the controller 201 checks whether the occupant step 301 is set. Even if the occupant step is not set (NO in S403), in S405, the controller 201 will also check whether the tailgate 103 is set. In S417, the tailgate may be operated based on the detection of the kick gesture. Otherwise, both the occupant step and the tailgate may be set to operate in an interlocked manner, in which case in S415 the controller 201 sends a signal to an actuator 239 to deploy the occupant step 301. Also, in S417, the controller 201 sends a signal to an actuator 231 to open the tailgate 103. When both the occupant step 301 and the tailgate 103 are set to operate in an interlocked manner, the controller 201 may instruct operation of both the occupant step 301 and the tailgate 103 substantially simultaneously. In some embodiments, the controller 201 may be configured to set a setting that prevents either the occupant step motor or the tailgate motor from being operated, or that prevents both the occupant step motor and the tailgate motor from operating.

In some embodiments, the tailgate 103 and the occupant step 301 may be operated using alternative forms of interaction. For example, the interior cabin of the vehicle may be equipped with a button, switch, or touchscreen interface 225, 227 that may be used to engage operation of the tailgate 103, occupant step 301 or both. However, an occupant may be outside of the vehicle and the rear of the vehicle may be near a wall or other obstacle such that the tailgate cannot be opened. The occupant may desire to use the occupant step 301 while the tailgate remains in the closed position. In some embodiments, the occupant step and tailgate can be switched from an interlocking state to a non-interlocking state using a sensor located on the exterior of the vehicle. In one embodiment, the kick sensor 305 may be configured to detect a swing gesture as an alternative gesture to a kick gesture. A kick gesture may be a movement that is toward the kick sensor such that the capacitance increases as the occupant's foot moves toward the capacitance sensor. A swing gesture may be a movement substantially parallel to the kick sensor such that a substantially constant capacitance is detected over a length direction of the sensor. When the controller 201 detects a swing gesture (YES in S407), in S409, the occupant step 301 and tailgate 103 can be switched from an interlocking state to a non-interlocking state. In S411, the controller 201 checks if the occupant step 301 is set to operate. When the occupant step 301 is set to operate (YES in S411), in S415 the controller 201 will send a single to an actuator to deploy the occupant step 301. While in the non-interlocking state, if the occupant step S411 is not set (NO in S411), in S417 the controller 201 will send a signal to an actuator to open the tailgate.

In some embodiments, instead of using two different gestures, the kick sensor 305 may be configured as two kick sensors, for example, a right kick sensor and a left kick sensor. Activating one of the two kick sensors will set the interlocking state, whereas activating the second kick sensor will set the non-interlocking state.

A vehicle may be equipped with a power back door (PBD) or a power side door (PSD). In some embodiments, instead of interlocking the occupant step 301 with a tailgate 103, the occupant step 301 may be interlocked with a power back door. In some embodiments, the occupant step 301 may be interlocked with a power side door. In this embodiment, the kick sensor may be incorporated into the occupant step and used to operate the occupant step and power back door in an interlocking or a non-interlocking fashion. In some embodiments, a powered occupant step may be a powered running board that extends out along a lower side of vehicle interlocked with opening of a power side door that is directly above the running board. In this embodiment, the kick sensor may be incorporated on the running board and used to operate the running board and the power side door in the interlocking or the non-interlocking fashion.

In some embodiments, the controller 201 may detect a pinch in either the occupant step 301 or the tailgate 103, or both, while the occupant step 301 is being deployed or while the tailgate 103 is opening. As mentioned above, a pinch may be detected when the spindle for the occupant step receives a force in the opposite direction of operation movement that is greater than a predetermined force threshold. In S419, when a pinch is detected (YES in S419), the controller 201 determines whether the occupant step 301 and tailgate 103 are interlocked. In some embodiments, when the controller 201 detects a pinch in either the occupant step 301 or the tailgate 103, the controller 201 may activate a warning buzzer. The warning buzzer may be one or more indicator lights, for example a blinking LED light, or may be a sound, such as a beeping sound, or may be both indicator lights and sound. The warning buzzer may inform an occupant that is being pinched that the occupant step 301 or tailgate 103, or both is being stopped due to pinching that exceeds a predetermined force. In some embodiments, the action of stopping an operation may allow for resuming operation if the pinching force is discontinued within a predetermined period of time. For example, if upon activating a warning buzzer, an occupant moves clear of the occupant step 301 and/or tailgate 103 that is undergoing a pinch force within a few seconds, the operation may be resumed as though no pinch had been detected.

In S423, when the controller 201 determines that the occupant step 301 and tailgate 103 are interlocked (YES in S421), the controller 201 will stop operation of both the occupant step 301 and the tailgate 103 substantially simultaneously. In some embodiments, the controller 201 may then operate both the occupant step 301 and the tailgate 103 to move in a reverse direction, in which case the occupant step 301 is moved to a retracted position and the tailgate 103 is moved to a closed position. Also, in some embodiments, if a pinch is detected while the occupant step 301 is being moved to a retracted position or while the tailgate 103 is being moved to a closed position, operation of both the occupant step 301 and the tailgate 103 is stopped. When the controller 201 determines that the occupant step 301 and the tailgate 103 are not interlocked, operation of one of the occupant step 301 and the tailgate 103 is stopped depending on which one the pinch is detected. Also, operation of one of the occupant step 301 and the tailgate 103 may be reversed after being stopped.

In some embodiments, the controller 201 is configured to monitor the state of the occupant step 301 and tailgate 103 based on signals sent to or received from a respective actuator 231, 233, 235, 237, and 239. In some embodiments, when the controller 201 detects one of the tailgate 103 and the occupant step 301 in the opened state, the state of both the tailgate and occupant step are set to the opened state.

Numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

What is claimed is:

1. An interlocking occupant step apparatus for a vehicle, comprising:
   a powered door;
   a powered occupant step;
   a kick sensor; and
   a controller having processing circuitry configured to:
   set an interlocking state where the powered door and the powered occupant step are to be jointly operated based upon a first gesture signal,
   while in the interlocking state where the powered door and the powered occupant step are to be jointly operated based upon the first gesture signal:
   detect the first gesture signal from the kick sensor,
   upon detection of the first gesture signal,
     control operation of the powered occupant step to move the powered occupant step to an extended position, and
     control operation of the powered door to move to an opened position, and
   detect a second gesture signal from the kick sensor, the second gesture signal being for a second gesture different from a first gesture corresponding to the first gesture signal, and
   upon detection of the second gesture signal while in the interlocking state where the powered door and the powered occupant step are to be jointly operated based upon the first gesture, switch to a non-interlocking state where the powered door and the powered occupant step are separately operable based upon the second gesture signal.

2. The apparatus of claim 1, wherein the kick sensor is mounted to the powered occupant step.

3. The apparatus of claim 1, wherein the processing circuitry is common processing circuitry for controlling operation of both the powered occupant step and the powered door.

4. The apparatus of claim 1, wherein the kick sensor is a capacitive sensor configured to:
   detect an approaching object by a change in capacitance as the first gesture, and
   detect an object moving in a length direction with a substantially constant capacitance as the second gesture.

5. The apparatus of claim 3, wherein when the first gesture signal from the kick sensor is detected, the common processing circuitry controls operation of the powered occupant step and the powered door substantially simultaneously.

6. The apparatus of claim 1, wherein in a case where the powered door is in a closed position, when the second gesture signal from the kick sensor is detected, the processing circuitry controls operation of the powered occupant step and maintains the powered door in the closed position.

7. The apparatus of claim 1, wherein
the powered door is a powered tailgate,
upon detection of the first gesture signal, the processing circuitry controls operation of the powered occupant step and the powered tailgate substantially simultaneously, and
upon detection of the second gesture signal and in a case where the powered tailgate is in a closed position, the processing circuitry controls operation of the powered occupant step to move to the extended position and maintains the powered tailgate in the closed position.

8. The apparatus of claim 4, wherein
the powered door is a powered tailgate,
upon detection of the first gesture signal, the processing circuitry controls operation of the powered occupant step and the powered tailgate substantially simultaneously, and
upon detection of the second gesture signal and in a case where the powered tailgate is in a closed position, the processing circuitry controls operation of the powered occupant step to move to the extended position and maintains the powered tailgate in the closed position.

9. The apparatus of claim 1, wherein
the powered door is a powered tailgate,
the vehicle includes a display having a customization menu, and
the customization menu includes an input for setting one of the powered tailgate and the powered occupant step to be operated when the detection of the second gesture signal switches to the non-interlocking state.

10. The apparatus of claim 1, wherein
the powered door is a powered side door and the powered occupant step is a motor-operated running board,
upon detection of the first gesture signal, the processing circuitry controls operation of the motor-operated running board and the powered side door substantially simultaneously, and
upon detection of the second gesture signal and in a case where the powered side door is in a closed position, the processing circuitry controls operation of the motor-operated running board to lower to an opened position and maintains the powered side door in the closed position.

11. The apparatus of claim 1, wherein
the powered door is a powered side door and the powered occupant step is a motor-operated running board,
the vehicle includes a display having a customization menu, and
the customization menu includes an input for setting one of the powered side door and the motor-operated running board to be operated when the detection of the second gesture signal switches to the non-interlocking state.

12. The apparatus of claim 1, wherein
the powered door is a powered back door,
upon detection of the first gesture signal, the processing circuitry controls operation of the powered occupant step and the powered back door substantially simultaneously, and
upon detection of the second gesture signal and in a case where the powered back door is in a closed position, the processing circuitry controls operation of the powered occupant step to move to a retracted position and maintains the powered back door in the closed position.

13. The apparatus of claim 1, wherein
the powered door is a powered back door,
the vehicle includes a display having a customization menu, and
the customization menu includes an input for setting one of the powered back door and the powered occupant step to be operated when the detection of the second gesture signal switches to the non-interlocking state.

14. The apparatus of claim 1, wherein the kick sensor includes:
a first sensor for detecting a first kick signal as the first gesture signal, and
a second sensor for detecting a second kick signal as the second gestures signal.

15. The apparatus of claim 14, wherein the first sensor and the second sensor are mounted to the powered occupant step.

16. A method for an interlocking occupant step apparatus for a vehicle, the method comprising:
setting, by processing circuitry, an interlocking state where a powered door and a powered occupant step are to be jointly operated based upon a first gesture signal;
while in the interlocking state where the powered door and the powered occupant step are to be jointly operated based upon the first gesture signal:
detecting, by the processing circuitry, the first gesture signal from a kick sensor;
upon detection of the first gesture signal,
controlling, by the processing circuitry, operation of the powered occupant step to move the occupant step to an extended position; and
controlling, by the processing circuitry, operation of the powered door to move to an opened position; and
detecting, by the processing circuitry, a second gesture signal from the kick sensor, the second gesture signal being for a second gesture different from a first gesture corresponding to the first gesture signal; and
upon detection of the second gesture signal while in the interlocking state where the powered door and the powered occupant step are to be jointly operated based upon the first gesture, switching, by the processing circuitry, to a non-interlocking state where the powered door and the powered occupant step are separately operable based upon the second gesture signal.

17. The method of claim 16, further comprising:
detecting an approaching object by a change in capacitance as the first gesture, and
detecting an object moving in a length direction with a substantially constant capacitance as the second gesture.

18. The method of claim 16, further comprising controlling, by the processing circuitry, operation of the powered occupant step and the powered door substantially simultaneously when the first gesture signal from the kick sensor is detected.

19. The method of claim 16, further comprising, in a case where the powered door is in a closed position, controlling, by the processing circuitry, operation of the powered occupant step and maintaining, by the processing circuitry, the powered door in the closed position when the second gesture signal from the kick sensor is detected.

20. The method of claim 16, wherein
the powered door is a powered tailgate, and
the method further comprises:

upon detection of the first gesture signal, controlling, by the processing circuitry, operation of the powered occupant step and the powered tailgate substantially simultaneously upon detection of the first gesture signal, in a case where the powered tailgate is in a closed position and upon detection of the second gesture signal, controlling, by the processing circuitry, operation of the powered occupant step to move to the extended position and maintaining, by the processing circuitry, the powered tailgate in the closed position.

* * * * *